United States Patent
Sheu et al.

[11] Patent Number: 6,146,950
[45] Date of Patent: Nov. 14, 2000

[54] METHOD OF MANUFACTURING MULTIPLE METALLIC LAYERED EMBEDDED ROM

[75] Inventors: Shing-Ren Sheu, Taoyuan Hsien; Chin-Lung Chen, Hsinchu Hsien; Tzyy-Jye Lin, Hsinchu, all of Taiwan

[73] Assignee: United Microelectronics Corp., Hsinchu, Taiwan

[21] Appl. No.: 09/389,722

[22] Filed: Sep. 3, 1999

[30] Foreign Application Priority Data

May 26, 1999 [TW] Taiwan ................................ 88108621

[51] Int. Cl.$^7$ .............................................. H01L 21/8246
[52] U.S. Cl. .......................................... 438/275; 438/278
[58] Field of Search ..................................... 438/275–278

[56] References Cited

U.S. PATENT DOCUMENTS

5,681,772 10/1997 Chen et al. .
5,744,394  4/1998 Iguchi et al. ............................ 438/276

*Primary Examiner*—Jey Tsai
*Attorney, Agent, or Firm*—Charles C. H. Wu; Charles C. H. Wu & Associates

[57] ABSTRACT

A method of manufacturing multiple metallic layered embedded ROM. A substrate has a memory cell region and a peripheral circuit region. A first gate and a first source/drain region are formed in the memory cell region. A second gate and a second source/drain region are formed in the peripheral circuit region. A first dielectric layer is formed over the substrate. A first contact is formed in the first dielectric layer in the periphery circuit region. A first patterned metallic layer that couple electrically with the first contact is formed in the peripheral circuit region. A second dielectric layer is formed over the substrate. A portion of the second dielectric layer in the memory cell region is removed to form a remaining second dielectric layer having a sloping sidewall surrounds a periphery of the memory cell region. A via hole is formed in the second dielectric layer in the peripheral circuit region and a second contact opening is formed in the first dielectric layer in the memory cell region. The via hole exposes the first patterned metallic layer. A metallic barrier layer is formed over the substrate. Ions are implanted into coded regions in the substrate. A second patterned metallic layer is formed in the peripheral circuit region to cover the second dielectric layer and fill the via hole. A third patterned metallic layer is formed in the memory cell region to fill the contact opening. A passivation layer is formed over the substrate.

16 Claims, 7 Drawing Sheets

METHOD OF MANUFACTURING MULTIPLE METALLIC LAYERED EMBEDDED ROM

BACKGROUND OF THE INVENTION

1. Field of Invention

The present invention relates to a method of manufacturing integrated circuits. More particularly, the present invention relates a method of manufacturing a multiple metallic layered embedded read-only-memory (embedded ROM) that has fewer post-programming processing operations.

2. Description of Related Art

Applications of memories are widespread nowadays. To match the newer generation of lightweight and miniature communication products, the memories used inside must have high memory capacity, small volume occupation and high operating speed. Read-only-memory (ROM) is a type of memory for storing fixed data. ROM has been widely used in digital equipment such as mini-computers and micro-processing system to store fixed programs. The process of manufacturing ROM is rather complicated and involves a large number of steps. The material for carrying out each step must be carefully prepared and all the influencing factors must be properly controlled. Most ROM devices are physically the same except for the codes that need to be programmed in at the programming stage. Therefore, most of steps in the manufacturing of ROM right up to the programming stage can be performed in the factory, forming what is known as a semi-finished ROM product. When a customer sends in an order that requires a particular program, these semi-finished ROM products can be taken out from the warehouse to perform the necessary programming and post-program processing operations. With this arrangement, a turn around time (TAT) is shortened.

As market competition is high, the present trend is to integrate as many functional units onto a single chip as possible. This single chip system capable of performing multiple functions is commonly referred to as a system-on-chip (SOC). Right now, ROM, static random access memory (SRAM), dynamic random access memory (DRAM) logic circuits as well as other digital circuits are mostly fabricated on a single chip so that systems can be more lightweight and can operate faster. Embedded ROM is in fact a common name for these SOC chips.

Figure 1A:
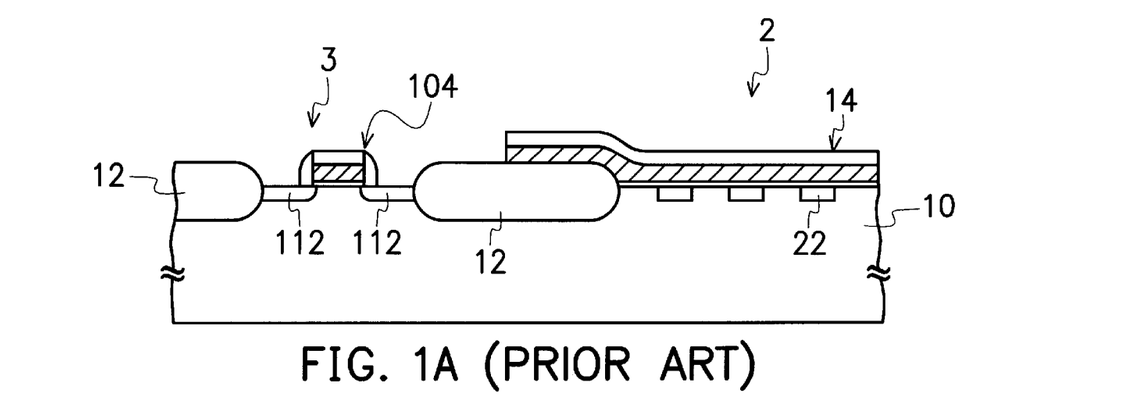
FIG. 1A through 1D are schematic, cross-sectional views showing the progression of manufacturing steps according to a conventional method for producing an embedded ROM unit.

FIGS. 1A through 1D are schematic, cross-sectional views showing the progression of manufacturing steps according to a conventional method for producing an embedded ROM unit. First, as shown in FIG. 1A, a substrate 100 is provided. Next, an isolation region 12 is formed in the substrate 10 so that active regions for accommodating memory cells (region 2) and peripheral circuit regions (region 3) are marked out. Thereafter, gate terminal 14 and source/drain regions 22 are formed in the memory cell region 2, and gate terminal 104 and source/drain regions 112 are formed in the peripheral circuit region 3. Hence, a semi-finished embedded ROM unit is formed and ready for programming and post-programming operations.

Figure 1B:
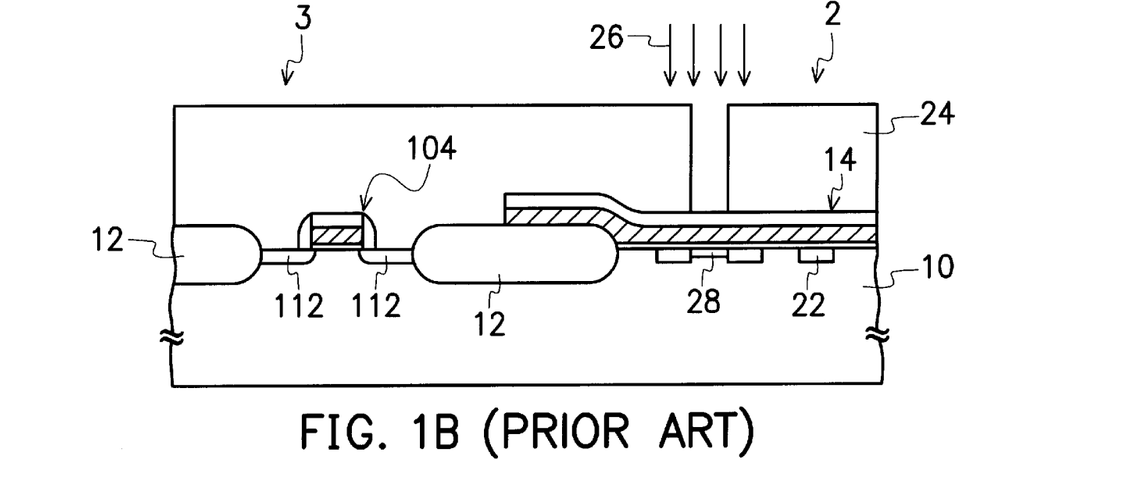

Next, as shown in FIG. 1B, programming and post-programming operations can start as soon as customer's program code arrives. First, a photoresist layer 24 is formed over the substrate 10, and then an ion implant operation 26 is carried out to form a code region 28.

Figure 1C:
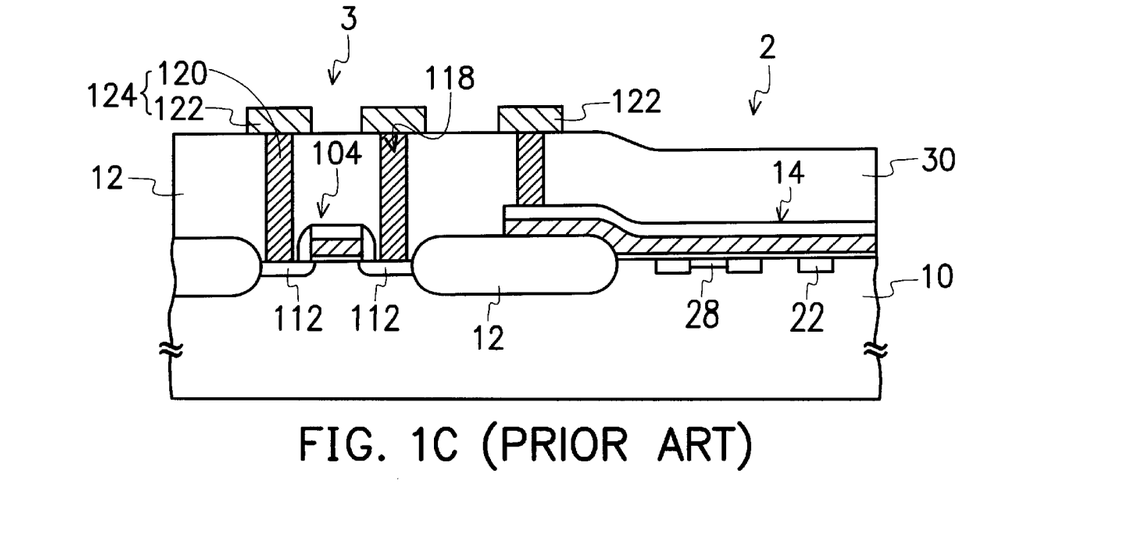

Next, as shown in FIG. 1C, the photoresist layer 24 is removed, and then a dielectric layer 30 is formed over the substrate 10. Thereafter, metallic interconnect layers 124 are formed in the peripheral circuit region 3. The metallic interconnect layers 124 is formed by forming a contact opening 118 in the dielectric layer 30, and then topping the contact opening 118 with metallic material to form a contact plug 120. Later, a layer of metal is deposited over the dielectric layer 30, and then photolithographic and etching operations are conducted to form a metal line 122.

Figure 1D:
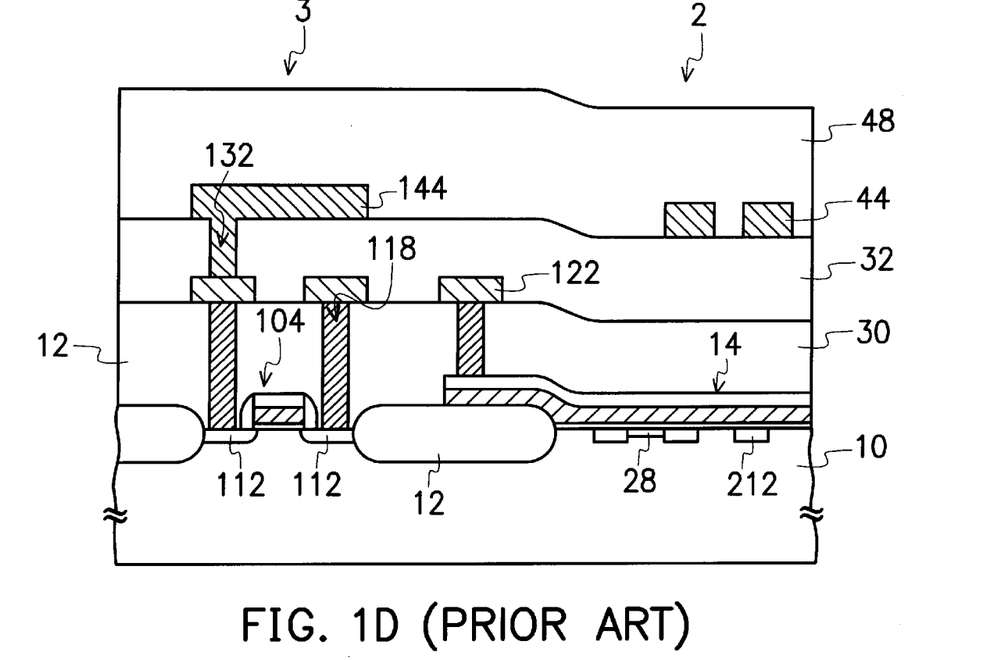

Next, as shown in FIG. 1D, metallic interconnect layers are formed in the peripheral circuit region 3 as well as the memory cell region 2. The metallic interconnect layers is formed by depositing a dielectric material over the substrate 10 to form a dielectric layer 32. The dielectric layer 32 in the peripheral circuit region 3 and the dielectric layers 30 and 32 in the memory cell 2 region are etched, so that a via hole 132 is formed in the peripheral region 3 and another contact opening (not shown in the figure) is formed in the memory cell region 2. Thereafter, metallic material is deposited to fill the via hole 132 and the contact opening, and then photolithographic and etching operations are conducted to pattern the metallic layer. Ultimately, conductive line 44 is formed over the memory cell region 2 while conductive line 144 is formed over the peripheral circuit region 3. Finally, a passivation layer 48 is formed over the substrate 10 by deposition, hence completing the steps necessary for fabricating the embedded ROM.

However, for the aforementioned method, a number of depositions, photolithographic and etching operations have to be conducted after the arrival of customer's programming code. When there are two levels of metallic interconnection layers in the peripheral region of the ROM, a long turn around time is needed for finish all the processing operations after performing the ion implant operation necessary for coding a customer supplied program into an embedded ROM. As the level of circuit integration continue to increase, more levels of metallic interconnect layers must be used. However, if the conventional method is still used, turn around times of products will have to be extended.

SUMMARY OF THE INVENTION

The invention provides a method of manufacturing multiple metallic layered embedded ROM that can shorten the promised delivery date to the customer. A substrate has a memory cell region and a peripheral circuit region. A first gate and a first source/drain region are formed in the memory cell region. A second gate and a second source/drain region are formed in the peripheral circuit region. A first dielectric layer is formed over the substrate. A first contact is formed in the first dielectric layer in the periphery circuit region. A first patterned metallic layer that couple electrically with the first contact is formed in the peripheral circuit region. A second dielectric layer is formed over the substrate. A portion of the second dielectric layer in the memory cell region is removed to form a remaining second dielectric layer having a sloping sidewall surrounds a periphery of the memory cell region. A via hole is formed in the second dielectric layer in the peripheral circuit region and a second contact opening is formed in the first dielectric layer in the memory cell region. The via hole exposes the first patterned metallic layer. A metallic barrier layer is formed over the substrate. Ions are implanted into coded regions in the substrate. A second patterned metallic layer is formed in the peripheral circuit region to cover the second dielectric layer and fill the via hole to electrically coupled with the first patterned metallic layer. A third patterned metallic layer is formed in the memory cell region to fill the contact opening. A passivation layer is formed over the substrate.

According to the embodiment of this invention, the semi-finished embedded ROM product already has gate terminals and source/drain regions in various memory cell regions and peripheral circuit regions, and one or more metallic interconnect layers are already prefabricated in the peripheral circuit region even before the arrival of a customer's code. Therefore, as soon as the customer's code arrives, only few more processing operations are required. They includes program coding, fabrication of the conductive line in the memory cell region, fabrication of the uppermost metallic interconnect layer in the peripheral circuit region and the formation of a passivation layer over the entire chip. Consequently, processing time after the arrival of the code can be shortened considerably.

In addition, due to the presence of a sloping dielectric sidewall in the peripheral circuit region, stringers are rarely formed when the metallic layer in the memory cell region or the peripheral circuit region is etched to form metallic lines that connect with the source/drain regions in the memory cell region or to form the uppermost metallic interconnect in the peripheral circuit region. Hence, short-circuiting between neighboring conductive lines is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2I are schematic, cross-sectional views showing the progression of manufacturing steps in producing a multiple metallic layered embedded ROM that has fewer post-programming operations according to one preferred embodiment of the invention. FIG. 3 is a top view of FIGS. 2A through 2F.

Figure 2A:
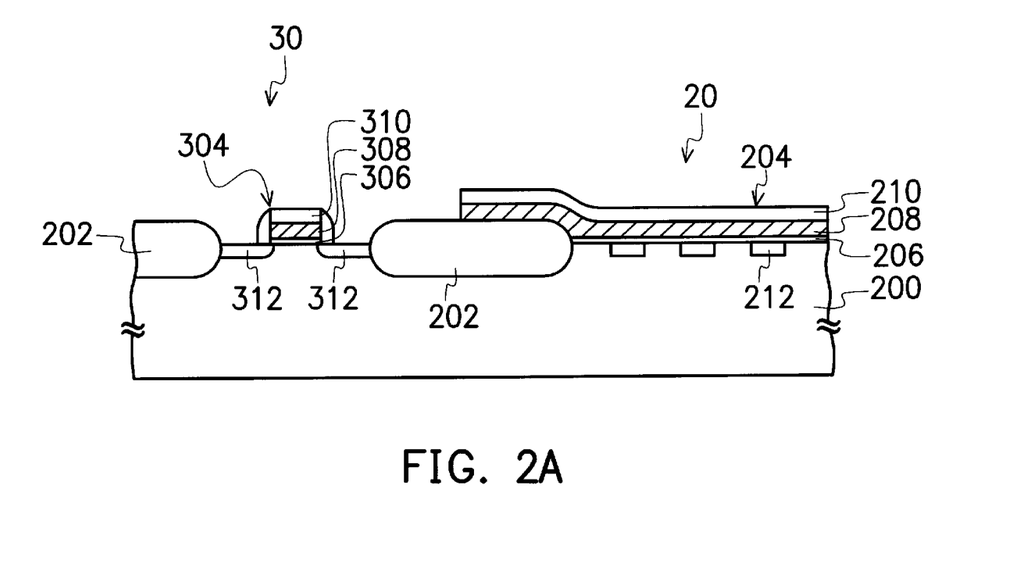
FIGS. 2A through 2I are schematic, cross-sectional views showing the progression of manufacturing steps for producing a multiple metallic layered embedded ROM according to one preferred embodiment of the invention.
Figure 3:
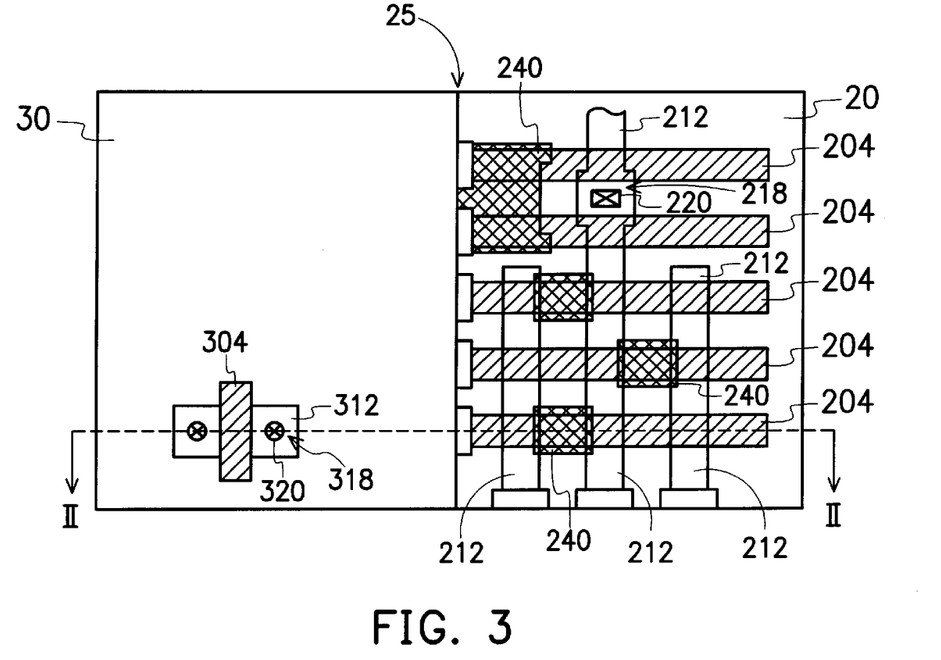
FIG. 3 is a top view of FIGS. 2A through 2F.

As shown in FIGS. 2A and 3, an isolation region 202 is formed in a substrate 200 so that active regions for forming a memory cell region 20 and a peripheral circuit region 30 are demarcated. The substrate 200 can be a p-type silicon substrate, for example. The isolation regions 202 can be formed using, for example, a shallow trench isolation (STI) method or a local oxidation of silicon (LOCOS) method. Gates 204 and source/drain regions 212 are formed in the memory cell region 20, and gates 304 and source/drain regions 312 are formed in the peripheral circuit region 30.

The gates 204 in the memory cell region 20 are composite structures that include, for example, a gate oxide layer 206, a polysilicon gate layer 208 and a metal silicide layer 210. Similarly, the gates 304 in the peripheral circuit region 30 are composite structures that include, for example, a gate oxide layer 306, a polysilicon gate layer 308 and a metal silicide layer 310. The gate oxide layers 206 and 306 are formed by thermal oxidation, for example. The polysilicon gate layers 208 and 308 are formed by chemical vapor deposition (CVD), for example. The metal silicide layers 210 and 310 are formed by sputtering or a self-aligned silicide (Salicide) process, for example. In addition, the source/drain regions 212 and 312 are preferably formed by, for example, ion implantation.

Figure 2B:
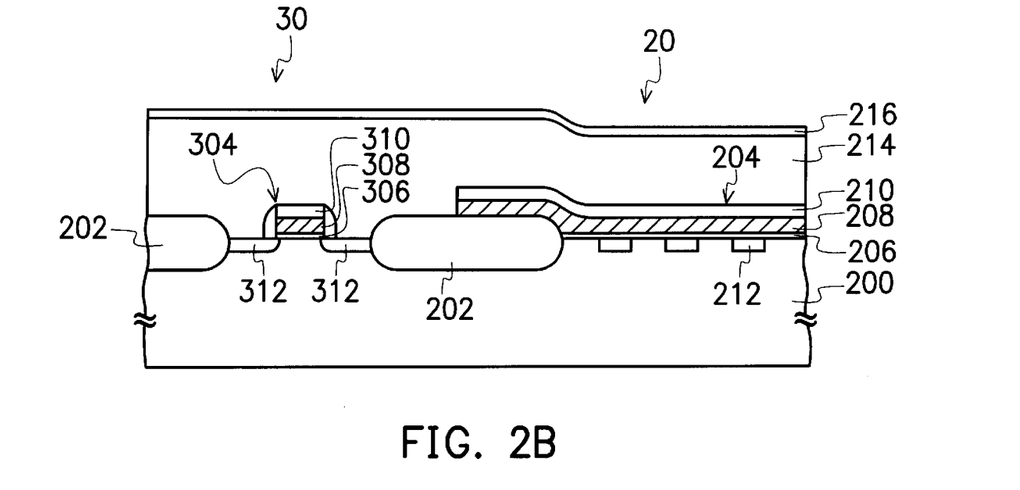

As shown in FIG. 2B and 3, a dielectric layer 214 is formed over the substrate 230. The dielectric layer 214 can be formed by the following exemplary steps. A silicon oxide layer having a thickness of about 1000Å is formed over the substrate 200 by plasma-enhanced chemical vapor deposition (PECVD). A borophosphosilicate glass (BPSG) layer having a thickness of about 2000Å is deposited over the silicon oxide layer. A thermal flow operation is carried out to increase the planarity of the dielectric layer 214. An etching stop layer 216 is formed over the dielectric layer 214. The etching stop layer 216 has a low etching rate than the dielectric layer 214, and hence is able to protect the dielectric layer 214 against a subsequent etching operation. The etching stop layer 216 can be, for example, a silicon nitride layer having a thickness of about 500Å. The silicon nitride layer 216 can be formed by, for example, chemical vapor deposition (CVD).

Figure 2C:
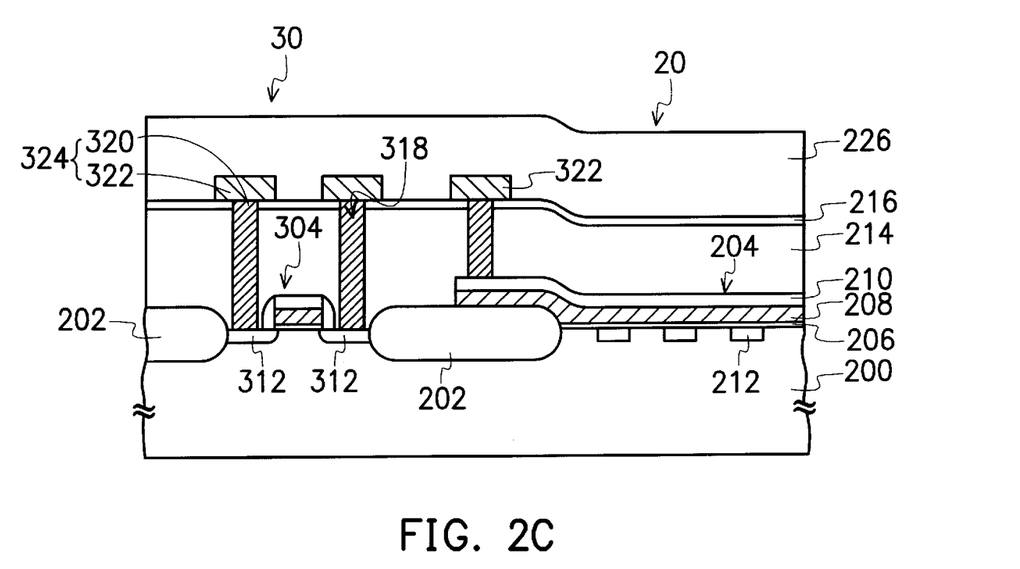

As shown in FIGS. 2C and 3, metallic interconnect layers 324 are formed in the peripheral circuit region 30. Each metallic interconnect layer 324 includes a plug 320 (or a contact) and a conductive line 322. The contact 320 is electrically coupled to the source/drain region 312 in the peripheral circuit region 30, whereas the conductive line 322 is electrically coupled to the contact 320.

Each contact 320 can be formed by, for example, first forming a contact opening 318 through the etching stop layer 216 and the dielectric layer 214 that correspond in position to the source/drain region 312, respectively, and then depositing metallic material (not shown) to fill the contact opening 318. The metallic material includes, for example, tungsten. Preferably, an adhesive layer, such as a titanium/titanium nitride layer is formed first before the metallic material is deposited into the contact opening 318 for increasing the adhesion between tungsten and the dielectric layer 214.

Each conductive line 322 is fabricated by first forming a metallic layer (not shown), for example, an aluminum, an aluminum-copper alloy, or a copper layer over the substrate 200, and then patterning the metallic layer using photolithographic and etching processes. The metallic layer can be formed by, for example, chemical vapor deposition or sputtering.

As shown in FIG. 2C, a second dielectric layer 226 is formed over the substrate 200. The dielectric layer 226 can be a silicon oxide layer, for example. Preferably, the dielectric layer 226 is formed by first depositing a silicon oxide layer (not shown) over the substrate 200 chemical vapor deposition (CVD), and then forming a spin-on-glass (SOG) layer (not shown) over the silicon oxide layer for local planarization. Another silicon oxide layer is formed over the spin-on-glass layer by PECVD, therefore forming a sandwich structure.

Figure 2D:
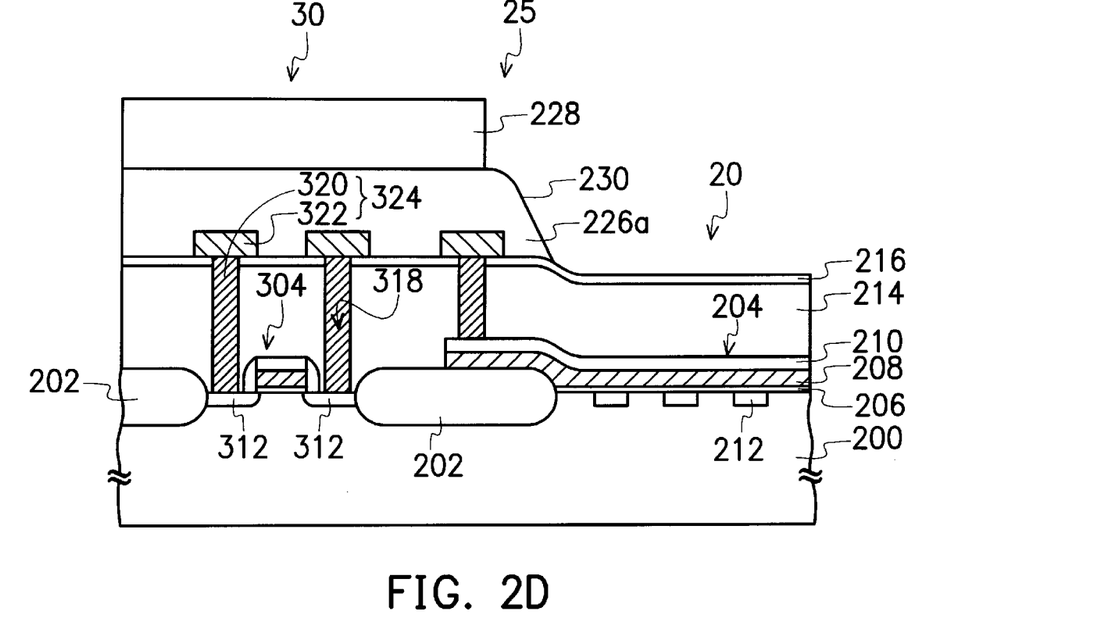

As shown in FIGS. 2D and 3, a mask layer 228, such as a photoresist layer, is formed on the dielectric layer 226 (shown in FIG. 2C) in the peripheral circuit region 30. The mask layer 228 covers the dielectric layer 226 in the peripheral circuit region 30 and exposes the dielectric layer 226 in the memory cell region 20. An etching operation is performed using the etching stop layer 216 as a stopping point to remove, to remove a portion of the dielectric layer 226. After etching, a remaining dielectric layer 226a is formed. The remaining dielectric layer 226a surrounds the periphery 25 of the memory cell region 20 forming a sloping sidewall 230 that extends from the peripheral circuit region 30. The etching operation is preferably an isotropic dry etching operation.

Since there is a high etching selectivity between the etching stop layer 216 and the dielectric layer 226 (shown in FIG. 2C), the etching stop layer 216 is able to protect the dielectric layer 214 from being etched. Because the etching stop layer 216 is able to protect the dielectric layer 214 during the etching operation, the dielectric layer 214 remains intact. Hence, the dielectric layer 214 can maintain a uniform thickness that favors subsequent coding operation.

Figure 2E:
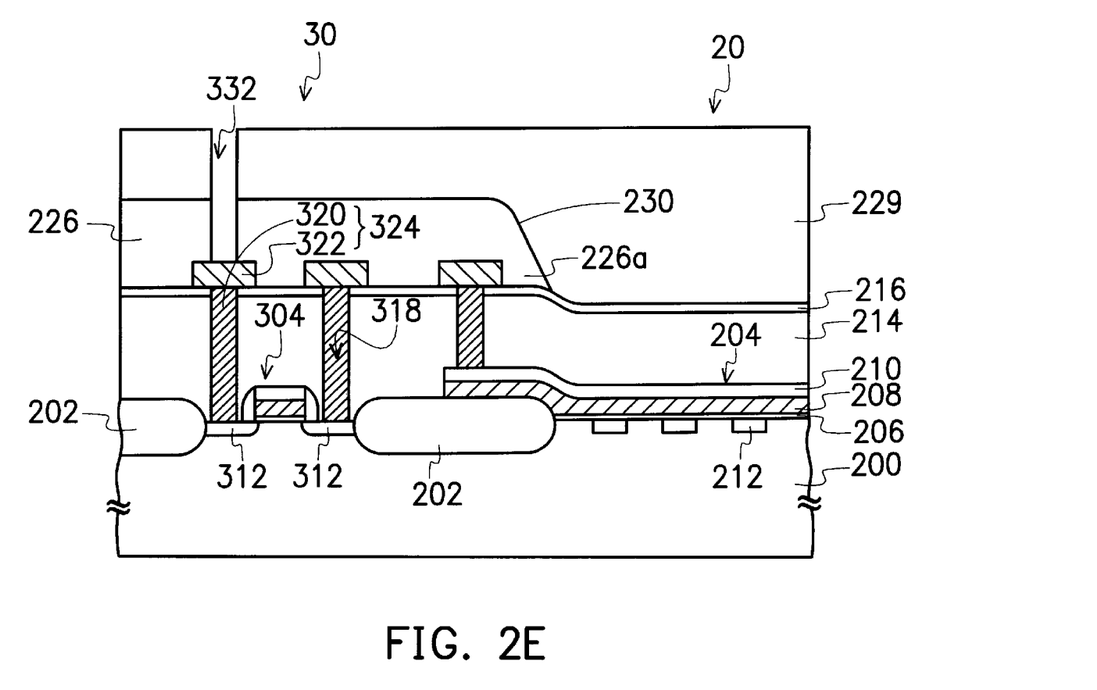

As shown in FIGS. 2E and 3, the mask layer 228 is removed. A mask layer 229 is formed over the substrate 200 by, for example, photolithography. The mask layer 229 comprises a photoresist layer. An etching step is performed with the mask layer 229 serving as a mask. The dielectric layer 226a not covered by the mask layer 229 in the peripheral circuit region 30 is etched. Meanwhile, the etching stop layer 216 and the dielectric layer 214 not covered by the mask layer 229 in the memory cell region 20 are etched (not shown in FIG. 2E). A via hole 332 that exposes a portion of the conductive line 322 is formed in the peripheral circuit region 30. In addition, a contact opening 218 (shown in FIG. 3) is formed in the memory cell region 20.

Figure 2F:
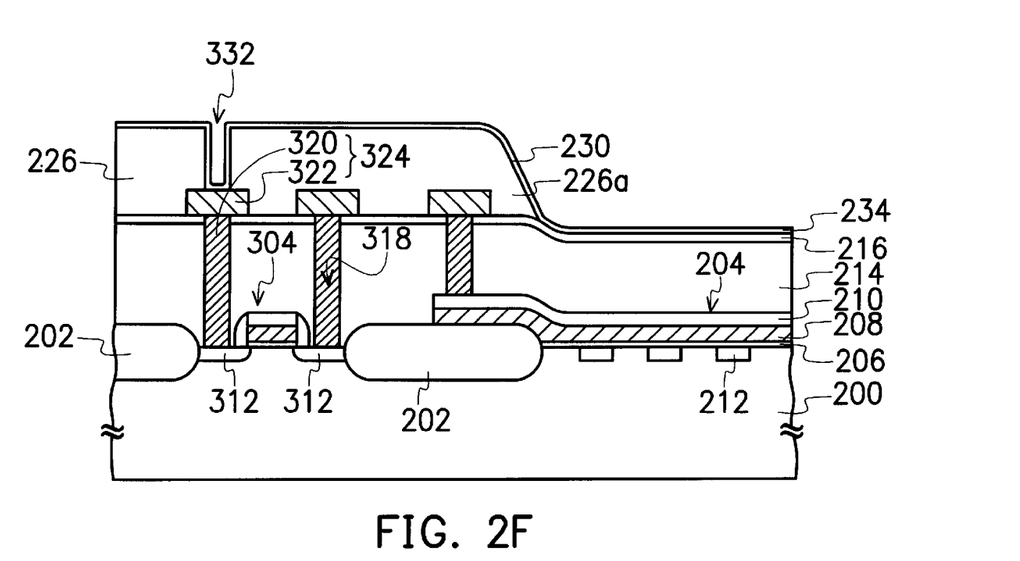

As shown in FIGS. 2F and 3, the mask layer 229 is removed, and then a barrier layer 234 is formed over the substrate 200. The metallic barrier layer 234 covers the via hole 332 and the contact opening 218. The metallic barrier layer 234 can be, for example, a titanium/titanium nitride layer or a tantalum/tantalum nitride layer. The barrier layer 234 can be formed by, for example, sputtering or chemical vapor deposition (CVD). After the metallic barrier layer 234 is formed, a semi-finished embedded ROM product is formed.

Figure 2G:
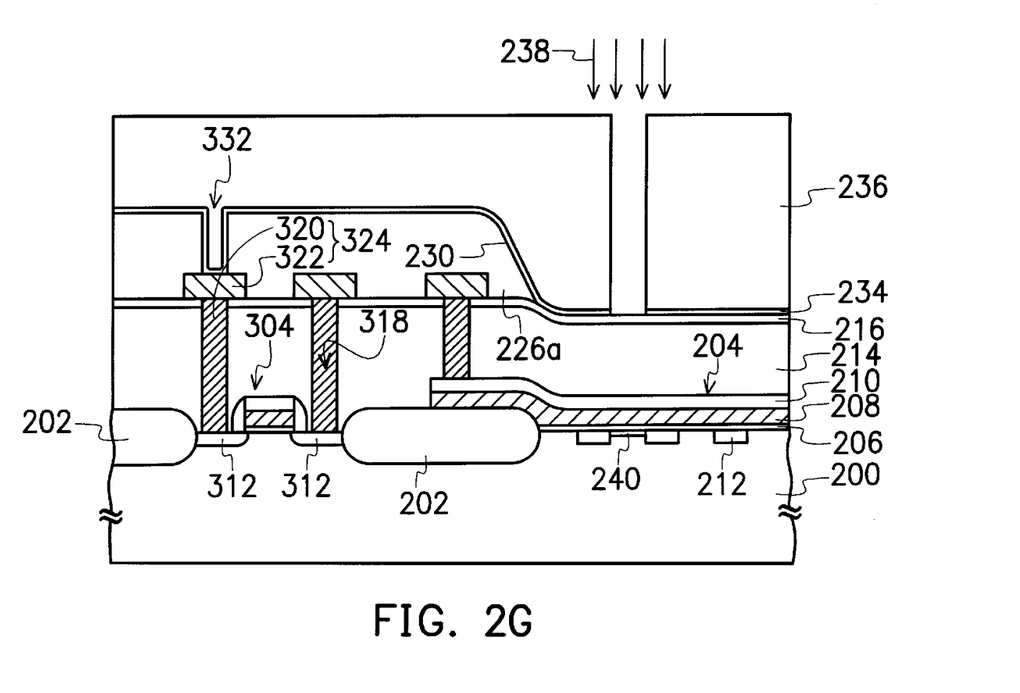

As shown in FIG. 2G, program coding and post-programming processing operations can be carried out as soon as a customer's code program arrives. A coding mask layer 236 is formed over the semi-finished ROM product of this invention. The metallic barrier layer 234 not covered by the coding mask layer 236 is removed. An ion implant operation 238 is carried out, implanting ions into the substrate 200 between the source/drain regions 212 to form a coded region 240. Since the dielectric layer 214 has a uniform thickness untouched by previous etching operation, various coded regions 240 can be formed in the ion implant operation 238 using the same level of energy and dosage. Hence, the same ionic concentration can be found in each of the coded region 240.

In addition, only moderate energy level is needed to implant ions into the substrate 200. The implant energy level is roughly below 180 KeV. Therefore, the embedded ROM of this invention not only can escape damage due to the use of a highly energetic ion beam, but also can reduce the severity of the ion diffusion problem due to a high concentration of ions in the coded region 240. Consequently, size of a memory cell can be reduced to increase the density of ROM devices.

Figure 2H:
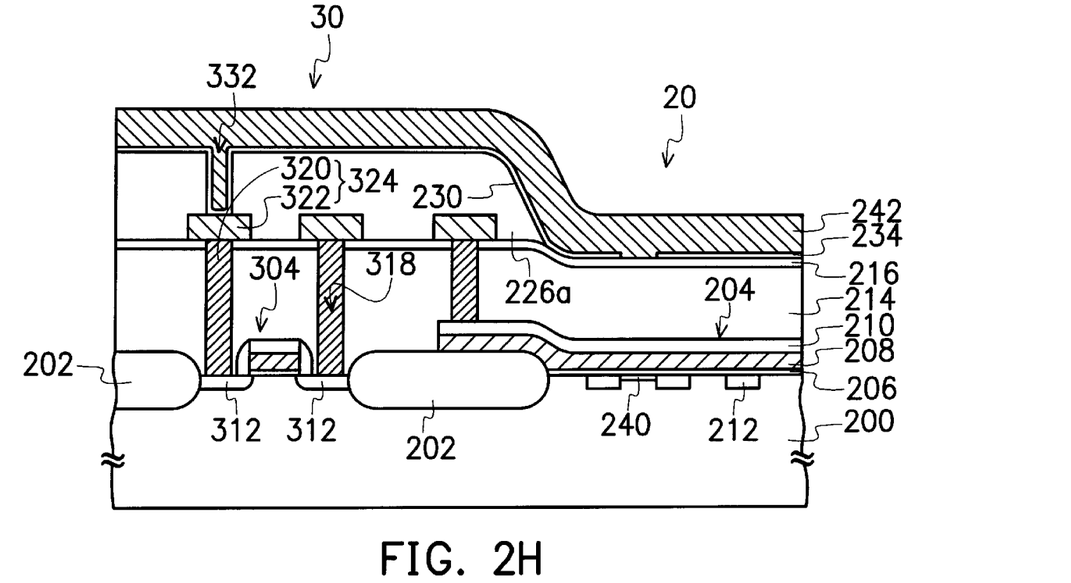
Figure 2I:
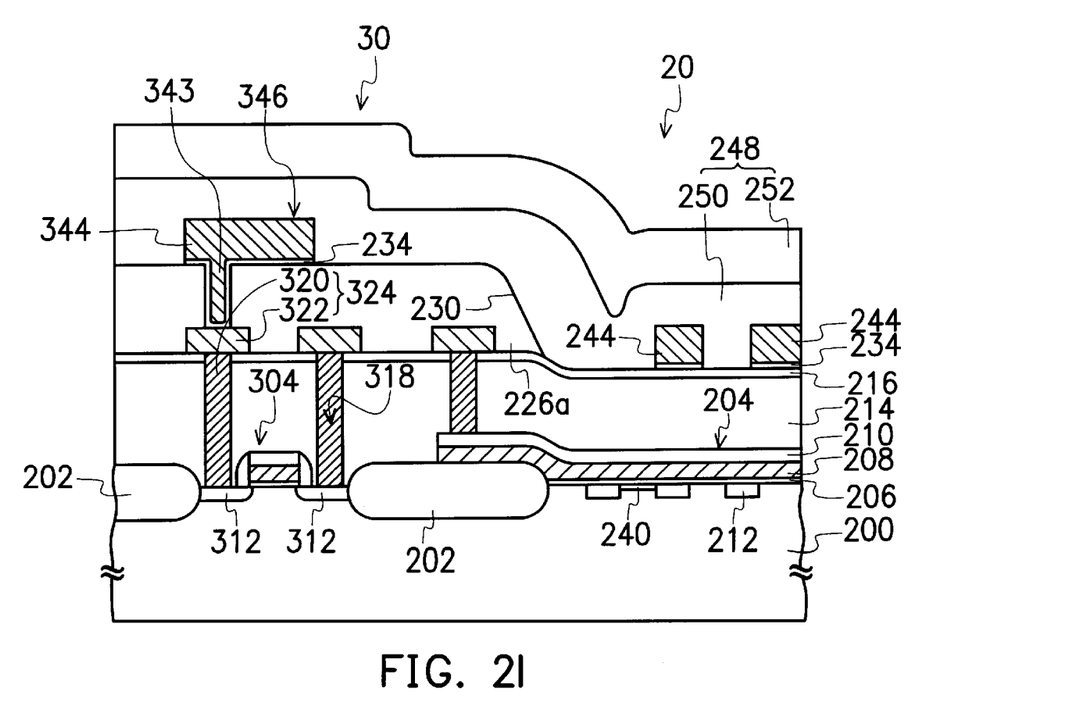

As shown in FIGS. 2H and 2I, the coding mask 236 is removed. Fabrication of the uppermost metallic interconnect 346 in the peripheral circuit region 30 and the fabrication of the contact 220 and the conductive line 244 (as shown in FIG. 2I) in the memory cell region 20 are carried out. A metallic layer 242 is formed over the substrate 200, covering the metallic barrier layer 234 and filling the via hole 332 in the peripheral circuit region 30 and the contact opening 218 in the memory cell region 20. The metallic layer 242 can be an aluminum layer formed by sputtering, for example.

As shown in FIG. 2I, photolithographic and etching operations are conducted to pattern the metallic layer 242 and the metallic barrier layer 234. Hence, conductive lines 244 and the contact 220 (shown in FIG. 3) are formed in the memory cell region 20, while conductive lines 344 and a via plug 343 of the uppermost metallic interconnect 346 are formed in the peripheral circuit region 30. A passivation layer 248 is formed over the substrate 200. The passivation layer 248 can be formed, for example, by first depositing a phosphosilicate glass (PSG) layer 250 having a thickness of about 5000Å over the substrate 200 by chemical vapor deposition (CVD), and then depositing a silicon nitride layer 252 having a thickness of about 7000Å over the PSG layer 250.

Since the dielectric layer 226a in the peripheral circuit region forms a sloping sidewall 230 near the edge of the memory cell region 20, the formation of stringers when the metallic layer 242 is patterned by etching can be avoided. Without metallic stringers, short-circuiting between the neighboring conductive lines 244 is prevented.

In addition, gates 204, source/drain regions 212, dielectric layer 214, contacts 212 in the memory cell region 20 as well as gates 304, source/drain regions 312, contacts 312 and all the metallic interconnect layers 324 below the uppermost metallic interconnect in the peripheral circuit region 30 are fully fabricated before the arrival of customer's program code. Therefore, on arrival of the customer code, a semiconductor factory only needs to bring out the semi-finished embedded ROM product from the warehouse, and then go ahead with ion implant coding operation 238, the formation of the uppermost metallic interconnect 346 in the peripheral circuit region 30, the deposition and patterning of the metallic layer 242 and the deposition of the passivation layer 248. Taken together, these operations may require a processing time no longer than 6–8 days. Therefore, the method of this invention is able to reduce customer's product delivery date almost by half. The turn around time thus is shortened.

Although two layers of metallic interconnects are shown in the embodiment of this invention, the actual number of layers that can be formed should by no means be restricted. Anybody familiar with the fabrication of semiconductor devices will know that the number of interconnect layers can be increased to obtain a higher device packing density of devices and executional efficiency.

In summary, this invention provides at least advantages as following:

1. The invention is able to shorten the turn around time to customer.

2. A moderate energy level is required for implanting ions into substrate during coding operation. Thus, the fabrication cost is reduced.

3. The invention is suitable for producing ROM having a multiple of metallic interconnect layers.

4. The invention not only can escape damage due to the use of a highly energetic ion beam, but also can reduce the severity of the ion diffusion problem. Thus, size of a memory cell can be reduced to increase the integration of ROM devices.

5. The invention is able to increase executional efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing multiple metallic layered embedded read-only-memory (ROM), comprising:

providing a substrate having a memory cell region and a peripheral circuit region thereon;

forming a first gate and a first source/drain region in the memory cell region;

forming a second gate and a second source/drain region in the peripheral circuit region;

forming a first dielectric layer over the substrate;

forming a first contact in the first dielectric layer in the periphery circuit region;

forming a first patterned metallic layer that couple electrically with the first contact in the peripheral circuit region;

forming a second dielectric layer over the substrate;

removing a portion of the second dielectric layer in the memory cell region to form a remaining second dielectric layer having a sloping sidewall surrounds a periphery of the memory cell region;

forming a via hole in the second dielectric layer in the peripheral circuit region and a second contact opening in the first dielectric layer in the memory cell region, wherein the via hole exposes the first patterned metallic layer;

forming a metallic barrier layer over the substrate;

coding by implanting ions into coded regions in the substrate;

forming a second patterned metallic layer in the peripheral circuit region to cover the second dielectric layer and fill the via hole to electrically coupled with the first patterned metallic layer;

forming a third patterned metallic layer in the memory cell region to fill the contact opening; and forming a passivation layer over the substrate.

2. The method of claim 1, wherein after the step of forming the first dielectric layer, further includes forming an etching stop layer over the first dielectric layer.

3. The method of claim 2, wherein the step of removing a portion of the second dielectric layer in the memory cell region includes the sub-steps of:

forming a patterned mask layer over the substrate;

performing an isotropic dry etching operation using the etching stop layer as a stopping point to remove a portion of the second dielectric layer in the memory cell region; and removing the patterned mask layer.

4. The method of claim 2, wherein the step of coding the embedded ROM includes the sub-steps of:

forming a patterned mask layer over the substrate;

removing a portion of the metallic barrier layer not being covered by the patterned mask layer;

implanting ions into the substrate using the patterned mask layer as a mask; and removing the patterned mask layer.

5. The method of claim 1, wherein the step of removing a portion of the second dielectric layer in the memory cell region includes using an isotropic dry etching operation.

6. The method of claim 1, wherein the step of coding the embedded ROM includes the sub-steps of:

forming a patterned mask layer over the substrate;

removing a portion of the metallic barrier layer not covered by the patterned mask layer;

implanting ions into the substrate using the patterned mask layer as a mask; and removing the patterned mask layer.

7. The method of claim 1, wherein the step of forming the second patterned metallic layer in the peripheral circuit region and the step of forming the third patterned metallic layer in the memory cell region includes the sub-steps of:

forming a fourth metallic layer over the substrate to cover the memory cell region and the peripheral circuit region and completely fill the via hole and the second contact opening; and patterning the fourth metallic layer to form the second patterned metallic layer and the patterned third metallic layer.

8. A method of manufacturing multiple metallic layered embedded read-only-memory (ROM), comprising the steps of:

providing a substrate having a memory cell region and a peripheral circuit region thereon;

forming a first gate and a first source/drain region in the memory cell region;

forming a second gate and a second source/drain region in the peripheral circuit region;

forming a first dielectric layer over the substrate;

forming a first metallic interconnect layer in the peripheral circuit region, wherein the first metallic interconnect layer includes a conductive line and a plug;

forming a second dielectric layer over the substrate;

removing a portion of the second dielectric layer in the memory cell region to leave a remaining second dielectric layer having a sloping sidewall surrounds a periphery of the memory cell region;

forming a via hole in the second dielectric in the peripheral circuit region and a contact opening in the first dielectric layer in the memory cell region, wherein the via hole exposes the first metallic interconnect layer;

coding by implanting ions into coded regions in the substrate;

forming a second metallic interconnect layer on the second dielectric layer to fill the dielectric layer opening in the peripheral circuit region;

forming a first patterned metallic layer in the memory cell region to fill the contact opening; and forming a passivation layer over the substrate.

9. The method of claim 8, wherein after the step of forming the first dielectric layer, further includes forming an etching stop layer over the first dielectric layer.

10. The method of claim 9, wherein the step of removing a portion of the second dielectric layer in the memory cell region includes the sub-steps of:

forming a patterned mask layer over the substrate;

performing an isotropic dry etching operation using the etching stop layer as a stopping point to remove a portion of the second dielectric layer in the memory cell region; and removing the patterned mask layer.

11. The method of claim 9, wherein the step of carrying out the coding operation includes the sub-steps of:

forming a patterned mask layer over the substrate;

removing a portion of the barrier layer not covered by the patterned mask layer;

implanting ions into the substrate using the patterned mask layer as a mask; and removing the patterned mask layer.

12. The method of claim 8, wherein the step of removing a portion of the second dielectric layer in the memory cell region includes using an isotropic dry etching operation.

13. The method of claim 8, wherein the step of coding the embedded ROM includes the sub-steps of:

forming a patterned mask layer over the substrate;

removing a portion of the barrier layer not covered by the patterned mask layer;

implanting ions into the substrate using the patterned mask layer as a mask; and removing the patterned mask layer.

14. The method of claim 8, wherein the step of forming the second metallic interconnect layer in the peripheral circuit region and the step of forming the first patterned metallic layer in the memory cell region includes the sub-steps of:

forming a second metallic layer over the substrate, wherein the second metallic layer covers the memory cell region and the peripheral circuit region and completely fills the via hole and the contact opening; and patterning the second metallic layer to form the second metallic interconnect layer and the patterned first metallic layer.

15. The method of claim 8, wherein the passivation layer comprises a phosphosilicate glass.

16. The method of claim 8, wherein the passivation layer comprises a silicon nitride layer.

* * * * *